United States Patent
Frey

(10) Patent No.: US 7,948,816 B2
(45) Date of Patent: May 24, 2011

(54) ACCESSING DATA WITHIN A MEMORY FORMED OF MEMORY BANKS

(75) Inventor: Christophe Denis Lucien Frey, Meylan (FR)

(73) Assignee: ARM Limited, Cambridge (GB)

( * ) Notice: Subject to any disclaimer, the term of this patent is extended or adjusted under 35 U.S.C. 154(b) by 93 days.

(21) Appl. No.: 12/382,828

(22) Filed: Mar. 24, 2009

(65) Prior Publication Data

US 2010/0246278 A1 Sep. 30, 2010

(51) Int. Cl.
*G11C 7/00* (2006.01)

(52) U.S. Cl. .................. 365/194; 365/230.03; 365/205; 365/189.05

(58) Field of Classification Search .................. 365/194, 365/230.03, 189.05
See application file for complete search history.

(56) References Cited

U.S. PATENT DOCUMENTS 5,329,492 A * 7/1994 Mochizuki ............... 365/230.01

OTHER PUBLICATIONS

Min et al., "A Novel Dummy Bitline Driver for Read Margin Improvement in an eSRAM", *4th IEEE International Symposium on Electronic Design, Test & Applications*, 2008, pp. 107-110.
Amrutur et al., "A Replica Technique for Wordline and Sense Control in Low-Power SRAM's", *IEEE Journal of Solid-State Circuits*, vol. 33, No. 8, Aug. 1998, pp. 1208-1219.

* cited by examiner

*Primary Examiner* — Huan Hoang
(74) *Attorney, Agent, or Firm* — Nixon & Vanderhye P.C.

(57) ABSTRACT

A memory is disclosed that comprises: an input for receiving an input signal and an output for outputting data; a plurality of data storage cells for storing individual units of data; said plurality of data storage cells being arranged in an array; a plurality of said arrays; each of said arrays comprising detecting circuitry for detecting and outputting stored data in response to a control signal received at said detecting circuitry; delay circuitry for providing a delay to said control signal sent to said detecting circuitry of at least some of said plurality of arrays, said delay provided to said control signal being longer for at least one array located closer to an input and output of said memory than it is to at least one array located further from an input and output of said memory.

17 Claims, 6 Drawing Sheets x = number of rows
y = number of columns

ACCESSING DATA WITHIN A MEMORY FORMED OF MEMORY BANKS

BACKGROUND OF THE INVENTION

1. Field of the Invention

The field of the invention relates to memory devices and in particular to a memory formed of memory banks.

2. Description of the Prior Art

There is a desire for memory devices to have increased storage capacity, decreased power consumption and a decreased size. The individual semiconductor storage cells that form the memory devices and the input and output devices that allow access to them are not completely uniform and as the size of these devices decreases, this lack of uniformity increases. When designing a memory this lack of uniformity needs to be considered and the performance of the poorer components needs to be accounted for.

For example, with an SRAM memory, owing to a lack of uniformity in the bit cells and to possible offsets in the sense amplifiers sensing the signals in the bit cells, a voltage level that is greater than a level that most sense amplifiers would sense is chosen as a desired output level of a bit cell in order for it to safely provide a signal that the predicted worst sense amplifiers will be able to sense. FIG. 1 shows how a signal output from a bit cell varies with time. As can be seen from the different lines on this graph, that correspond to signals output by different bit cells, different sized signals are output by different cells, but they all increase with time. Thus, a delay time $\Delta T$ is provided between the bit cell being selected and the value being output, and this helps ensure that the value output by the cell will be sufficient to be detected by the sense amplifier. Thus, the length of this delay time is chosen so that the predicted worst cell in this set of cells will have reached a value required to trigger the worst sense amplifier that it is calculated is likely to be present. To estimate this, a statistical analysis of the performance of all the cells is performed. Once this delay time has been estimated it is input as the delay value in the delay circuit 12 in the memory cell 10, and this delays the data read signal that has been sent to the storage cell by $\Delta T$ before it is sent to the sense amplifier 14. Sense amplifier 14 then detects and outputs a signal read from the storage cell.

"A Replica Technique for Wordline and Sense Control in Low-Power SRAM" By Bharadwaj et al. IEE Journal of Solid State Circuits, Vol 33, No 8 August 1998 describes how these delays can be determined. "A Novel Dummy Bitline Driver for Read Margin Improvement in an eSRAM" by Yap San Min et a. $4^{th}$ IEEE International Symposium on Electronic Design, Test and Applications 2008, discloses a way of calculating the read timing margin of bit cells and a way of calculating the probability of meeting this constraint.

As memories become ever larger, the probability of cells with even worse characteristics occurring increases.

Furthermore, as memories become larger they are generally formed in banks that are individual memory arrays that are separately accessed. This is done to reduce RC delays which increase with the length of lines required to access individual storage cells within a large memory array.

Currently the delay time added between a request for data reaching a cell and a sense amplifier being enabled to detect and output the data is determined pessimistically to cover worst case predicted variations occurring in cells throughout the memory. It would be desirable to be able to improve the memory access so that a less pessimistic time could be used for at least some of the memory accesses.

SUMMARY OF THE INVENTION

A first aspect of the present invention provides a memory comprising: an input for receiving an input signal and an output for outputting data; a plurality of data storage cells for storing individual units of data, said plurality of data storage cells being arranged in an array; a plurality of said arrays; each of said arrays comprising detecting circuitry for detecting and outputting stored data in response to a control signal received at said detecting circuitry; delay circuitry for providing a delay to said control signal sent to said detecting circuitry of at least some of said plurality of arrays, said delay provided to said control signal being longer for at least one array located closer to an input and output of said memory than it is to at least one array located further from an input and output of said memory.

The present invention recognises that a memory formed of arrays or banks of storage cells has different delays between an input signal being received at the memory and the data requested being output from the memory for different arrays, owing to the different times that it takes for the signals to travel between the memory input and output and the different arrays. For example, in FIG. 2 which shows a very simplified schematic view of a memory 20 according to the prior art that is formed of arrays or banks 0,1,2 and 3 arranged in a column, the time taken for an input signal CK to trigger output of data Q depends on the bank accessed. The time taken to access bank 0 is the time taken for the input signal to reach bank 0 which is t1, plus the time taken for it to be processed by bank 0 t3, plus the time taken for the data to reach the output t2, thus, the total delay is t1+t2+t3. Although t3, the time taken to process the signal is constant for each bank, the time taken for the signal to reach the bank and for the data to reach the output from the bank differs with the location of the bank. Thus, in this example the time taken to access bank 3, for example is 4(t1+t2)+t3.

Having recognised this, the present invention uses this property to provide different delays to the control signal triggering the detection and output of the data in at least some of the arrays. In this way an additional delay between the input signal being received at a cell and that data being output from it can be provided for some arrays. If this is done for arrays that are closer to the input and output and thus, have smaller access delay times, then this additional delay can be provided without increasing the time required to access the data. Providing an additional delay for some arrays increases the $\Delta T$ of FIG. 1 for these arrays, and therefore the safety margin for the output value having reached the required value. This can improve the yield of the memory.

In some embodiments, said memory further comprises an input for receiving an input control signal for controlling access to data stored in said memory; an output for outputting data from said memory in response to said input control signal; input data communication circuitry for providing data communication of said input control signal to said plurality of arrays; output data communication circuitry for providing data communication between said output and said plurality of arrays; wherein said delay circuitry is adapted to provide said delay to said control signal sent to said detecting circuitry of at least some of said arrays that has a value dependent upon at least one of an input delay, said input delay being a time taken for said input control signal to reach said array, and an output delay, said output delay being a time taken for said data from said array to reach said output.

As noted previously, a memory formed of arrays of storage cells has different delays between the input signal being received at the memory and the data requested being output from the memory. Providing a delay to the control signal sent to the detecting signal to at least some of the arrays that has a value dependent on these input and output delays enables the delay between requesting a signal and it being detected and output by the detecting device to be increased for some cells in dependence upon this value and thereby increase their safety margin for detecting the value without affecting the time for accessing data in the memory.

In some embodiments, said delay circuitry is adapted to provide a shorter delay to one of said plurality of arrays having a longer input and output delay and a longer delay provided to one of said plurality of arrays having a shorter input and output delay.

By providing a shorter delay to arrays having longer input and output delays and longer delays to arrays having shorter input and output delays, the overall delay between a request signal being received and the data being output can stay the same while increasing the delay between the request signal being received and the data being output at some of the arrays, thereby increasing their safety margin.

In some embodiments, said delay circuitry is adapted to provide said delay to said control signal sent to said detecting circuitry of each of at least some of said arrays such that a sum of said input delay, said output delay and said delay added by said delay circuitry is substantially equal for said at least some of said arrays.

It may be advantageous for the additional delay provided to some arrays to be as long as possible without affecting the performance of the memory. To do this the total delay that is the input delay, the output delay and the delay added by the delay circuit should be made substantially equal for at least some of the arrays.

In some embodiments, said delay circuitry comprises an initial delay element for providing a first delay to said control signal sent to all of said arrays and further delay elements for providing further delays to said control signal sent to at least some of said arrays.

In order for values to be reliably detected and output by the detecting circuitry the control signal is delayed by a predetermined amount to enable the signal held by the storage cells to reach a sufficient value for the detecting circuitry to be able to detect it. Thus, in embodiments of the present invention the delay circuitry comprises an initial delay element for providing this delay to all of the arrays, so that all of the arrays have at least this delay provided to them.

In some embodiments, said first delay is equal to a delay calculated as being required for a worst case storage cell that it is calculated will probably occur in at least one of said plurality of arrays.

This first delay may be a value that is calculated as being required for a storage cell with worse case performance that it is predicted will exist. This can be a storage cell that it is predicted will exist in a single one of the plurality of arrays or in a subset of them as further delays will be added for other arrays and thus, it is only one or possibly some arrays that receive the signal delayed by this amount. Thus, in this way the delay can be reduced for the memory as the predicted worst case cell for a single or several arrays is not as bad as the predicted worst case cell for the whole memory. Thus, a memory with increased performance can be provided.

Alternatively, in other embodiments, the first delay is calculated as it is calculated in conventional memories as being that required for a worst case storage cell that it is predicted will occur in the whole memory. In this case, a memory with the same timing performance as a conventional memory will be produced but it will have increased yield i.e., it will have a lower probability of having any memory storage cells that do not function correctly.

In some embodiments, said plurality of arrays are arranged in a memory bank array and said delay circuitry is adapted to add said delay to said control signal sent to one of said plurality of arrays in dependence upon a location of said one of said plurality of arrays within said memory bank array.

Memories that are formed of memory bank arrays where the plurality of arrays or banks are formed themselves in arrays have different delays for receiving input control signals and for outputting signals depending on their position in the array. They can therefore be provided with different delays for detecting and outputting signals according to their location within this array of banks.

In some embodiments, said control signal controlling said detecting circuitry and said input control signal received at said input are a same signal, said delay circuitry delaying said input control signal to said detecting circuitry and not to said data storage cells in said array.

Although, the input control signal requesting that data be output can be a different signal to the control signal controlling the detecting circuitry, in some embodiments it is the same signal, the signal controlling the detecting circuitry being a delayed version of the input control signal. In this way, the delay provided to the signal is the delay that the cell sees between the request for the data and the detecting circuitry being enabled.

In some embodiments, said input data communication circuitry comprises an input path for providing said input control signal to at least one of said storage cells of said array and a further input path for providing said input control signal to said detecting circuitry, said further input path including said delay circuitry and in some embodiments, said further input path is an extension of said input path.

Where the control signal controlling the detecting circuitry is the same as the input control signal then the delay circuitry may lie on an extension of an input path that provides the input control signal to the storage cells of the arrays. In this way, the signal travels to the arrays and is then delayed as it travels back to the arrays to control the detection circuitry.

Although the delay circuitry can comprise a number of things, in some embodiments it comprises buffers. Buffers are simple elements that provide a delay to a signal. Alternatively other elements such as inverters could be used provided account is taken of the required value of the signal.

Although the detecting circuitry can comprise a number of elements for detecting and outputting a value, in some embodiments it comprises at least one sense amplifier. Sense amplifiers are convenient elements for detecting and outputting values.

In some embodiments, said memory comprises a delay control input for receiving a signal indicating at least one value for at least one delay, said delay circuitry being programmable, such that at least one of said delays provided by said delay circuitry can be altered in response to said at least one value.

Although in some embodiments the value of the delays provided by the delay circuitry are set at design time in hardware by providing appropriate delay circuitry elements, in some embodiments the delay circuitry provided is programmable and can be set in response to values input at a delay control input. This enables the memory to be optimised for various situations by providing appropriate delays once the memory has been tested.

In some embodiments, said delay control input is for receiving a signal indicating maximum and minimum delay values, said delay circuitry comprising logic to calculate any intermediate delays in dependence upon said maximum and minimum delay values.

It may be that just the maximum and minimum delay values are input via the input and logic is used to calculate appropriate intermediate delay values for intermediate arrays.

In some embodiments, said memory further comprises a delay control input for receiving a signal indicating a value for said first delay, said first delay provided by said initial delay element depending on said value received at said delay control input.

In some embodiments the value of the first delay that is provided to all arrays and is dependent upon what is predicted to be the performance of a worst case cell is programmable and provided by an input and the other delay values are set in hardware by the delay circuitry. This may be a convenient way of providing in a simple way a programmable memory whose properties can be adjusted depending on circumstances and whose performance can thereby be improved.

Although the memory may take a number of forms, in some embodiments it is an SRAM memory comprising bit lines and said input control signal is an input signal to control said bit lines.

A second aspect of the present invention provides a method of reading data from a memory comprising a plurality of arrays of data storage cells for storing individual units of data, said method comprising the steps of: providing a data access signal to an input of said memory indicating a storage location of data to be accessed; providing a control signal to be sent to detecting circuitry located within said plurality of arrays, said detecting circuitry being for detecting and outputting stored data at an output in response to said control signal; delaying said control signal with respect to said data access signal by different amounts for at least some of said plurality of arrays, said delay provided to said control signal being longer for at least one array located closer to said input and output of said memory than it is to at least one array located further from said input and output of said memory.

A third aspect of the present invention provides, a memory comprising: a plurality of data storage cells for storing individual units of data, said plurality of data storage cells being arranged in an array; a plurality of said arrays; each of said arrays comprising detecting circuitry for detecting and outputting stored data in response to a control signal received at said detecting circuitry; delay circuitry for providing a delay to said control signal sent to said detecting circuitry of at least some of said plurality of arrays, said delay circuitry comprises an initial delay element for providing a first delay to said control signal sent to all of said arrays and further delay elements for providing further delays to said control signal sent to at least some of said arrays, a length of said further delays being inversely dependent on a time taken for an input data access signal to reach an array and an output data signal to reach an output of said memory from said array.

The above, and other objects, features and advantages of this invention will be apparent from the following detailed description of illustrative embodiments which is to be read in connection with the accompanying drawings.

DESCRIPTION OF THE PREFERRED EMBODIMENTS

Figure 3:
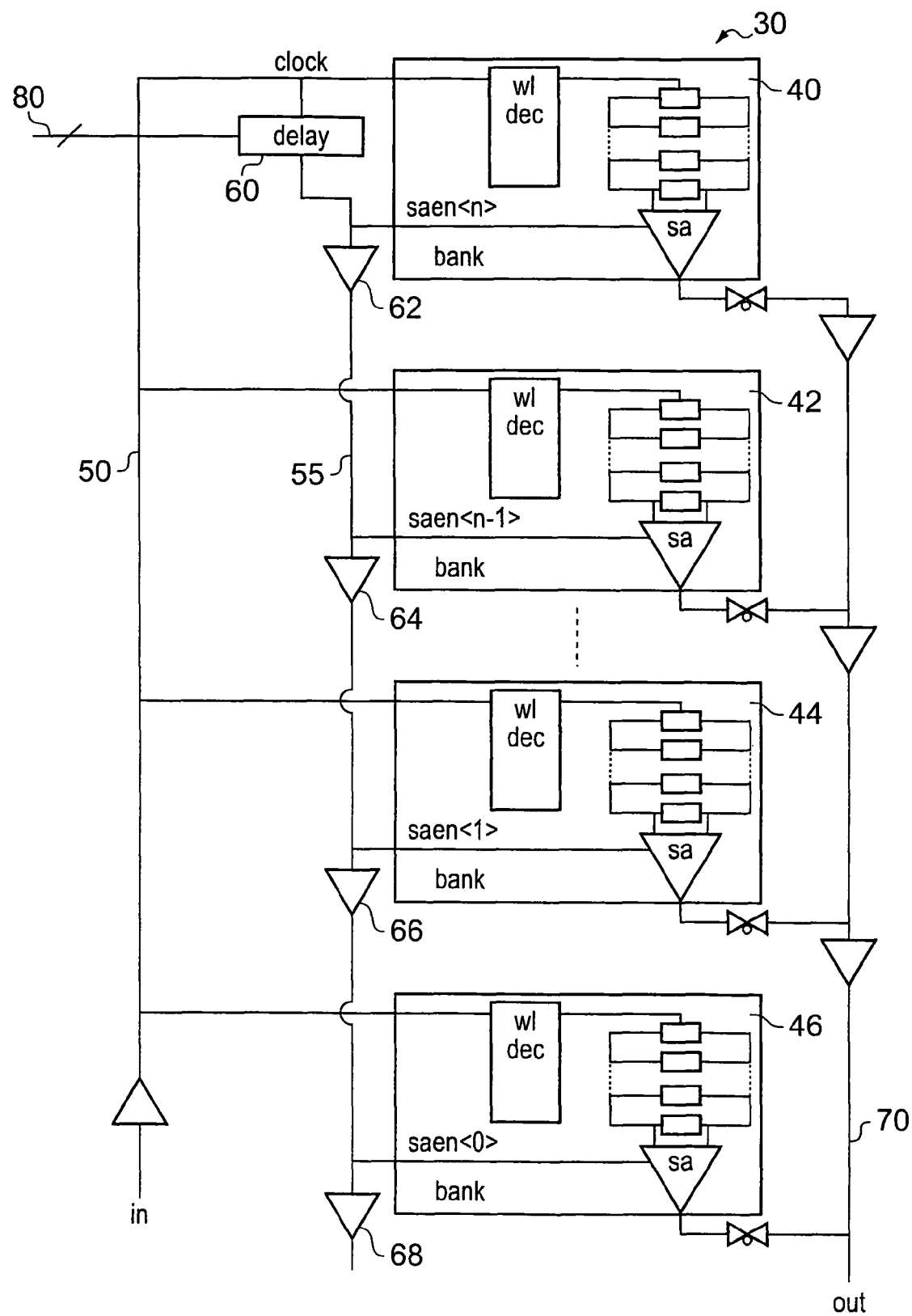
FIG. 3 shows a column of memory banks according to an embodiment of the present invention.

FIG. 3 shows a portion of a memory 30 having a plurality of memory banks 40, 42, 44, 46 that are similar to conventional memory banks and comprise storage elements that are accessed in response to an input signal and are output when the sense amplifier sa is enabled using the sense amplifier enable signal Saen.

Figure 1:
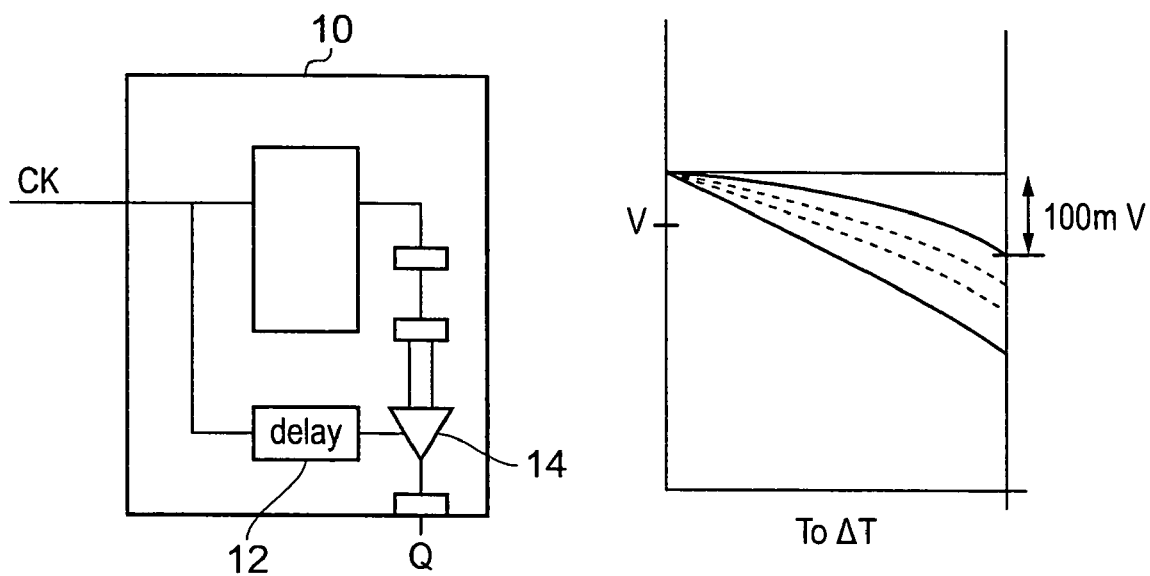
FIG. 1 shows a conventional memory bit cell and a graph showing the variation of the output voltage of this bit cell with time.
Figure 2:
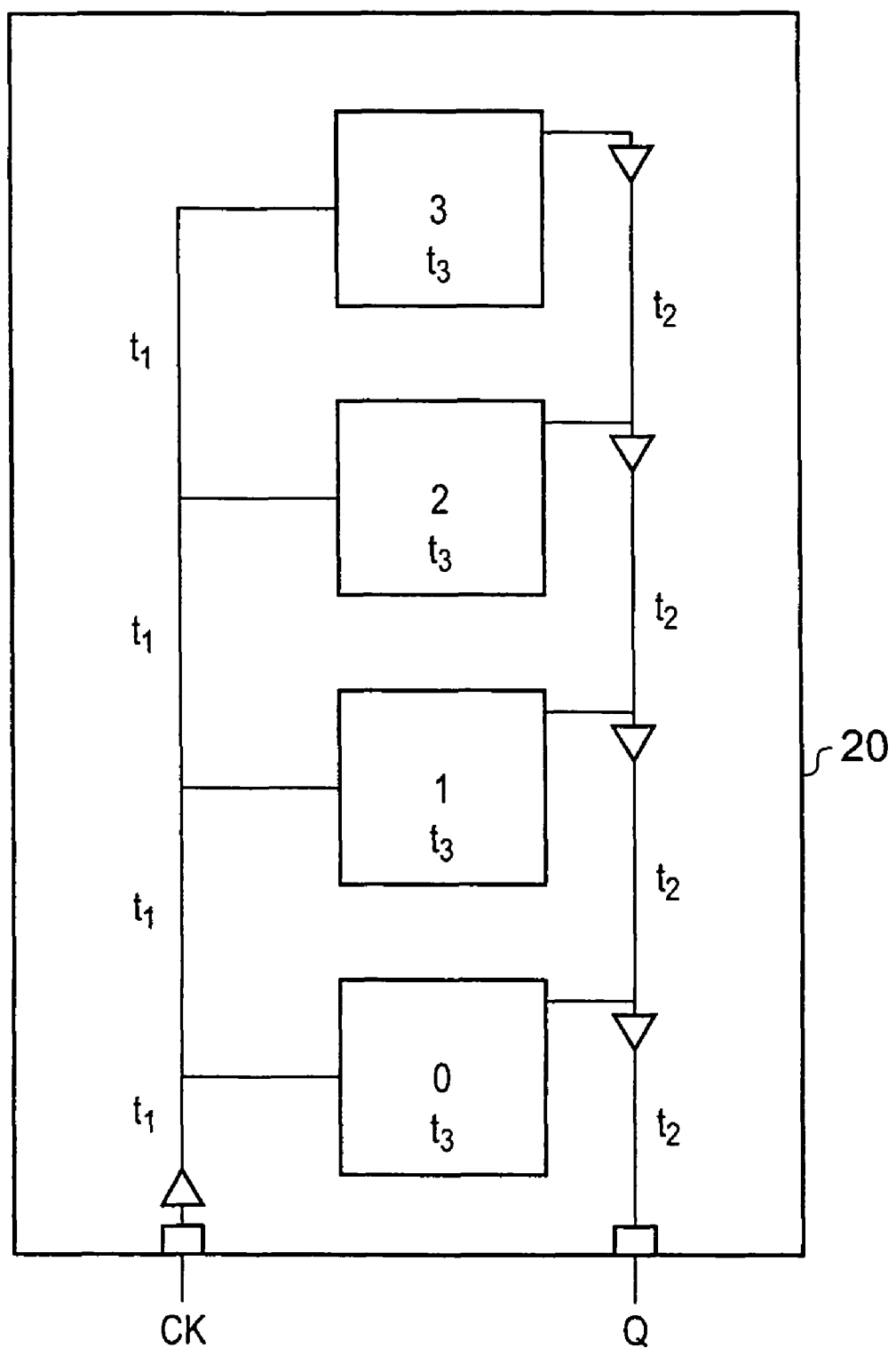
FIG. 2 schematically shows a memory having a column of memory banks and signal lines for input and out signals according to the prior art.

An input signal "in" is sent via input line 50 to each of the banks, and it then passes through delay element 60 that delays it by an amount equivalent to the $\Delta T$ of FIG. 1 before passing on down the extension 55 of the input line 50 which comprises various delay elements, buffers 62, 64, 66 and 68. Thus, this signal reaches the sense amplifier of each bank at a time that is delayed by the delay elements it passes through.

When the data is output from the sense amplifiers, it passes through transmission gates that are activated depending on the address of the access request, and along output line 70 which comprises buffers. Thus, the output signal from bank 40 is delayed by more than the output signal from bank 46. However, the sense amplifier enabling signal saen to bank 46 is delayed by more than the sense amplifier enabling signal to bank 40. Thus, the data is output from bank 40, before it would be output from bank 46, however, as it takes longer to reach the output the data will reach the output form both banks at about the same time. This means that the performance of the memory will not have been adversely affected by giving the sense amplifying signal to banks other than bank 40 a delay. However, the delay given to these banks will have improved the safety margins of these banks and thereby increased their yield.

In some embodiments it may be desirable to decrease the delay given by delay element 60 in the knowledge that for most banks this is not the delay that the bank will see, as this will be increased by the delay elements in the sense amplifier enabling signal line 55 (buffers 62 to 68). This means that a memory with increased performance but the same yield as a conventional memory without this feature could be generated. This is possible as the delay for delay element 60 is conventionally calculated for the whole memory, assuming variations that are likely to be found in a memory that is this size. However, if additional delays are provided for all but the memory banks that lie furthest from the input and output then the variations in the cells that need to be considered are only those that lie in these furthest banks. Decreasing the number of cells considered in such a statistical analysis decreases the probability of larger variations occurring (with a smaller sample there are less likely to be cells that are real outliers on a Gaussian distribution) and this thereby enables the selection of a smaller delay time for delay element 60.

The delay time for delay element 60 can be altered in the hardware of the memory, or in this embodiment it can be altered by inputting a delay value via input 80. In this embodiment delay element 60 is programmable and can be altered in response to values input at input 80. The other delay values are in this embodiment set at manufacture by hardware elements, in this case buffers 62-68

Figure 4:
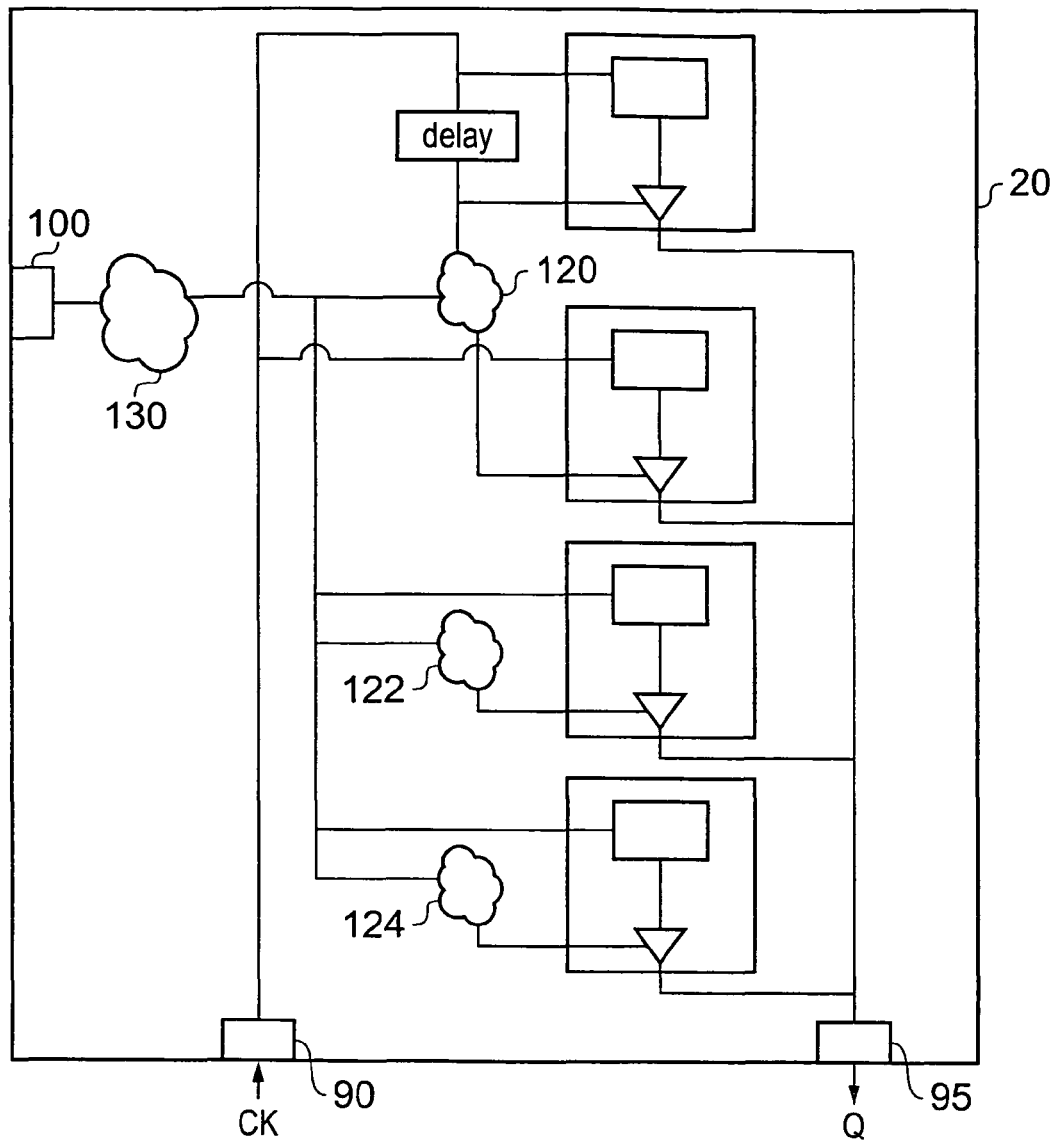
FIG. 4 shows a memory having a column of memory banks and programmable delays according to an embodiment of the present invention.
Figure 4:
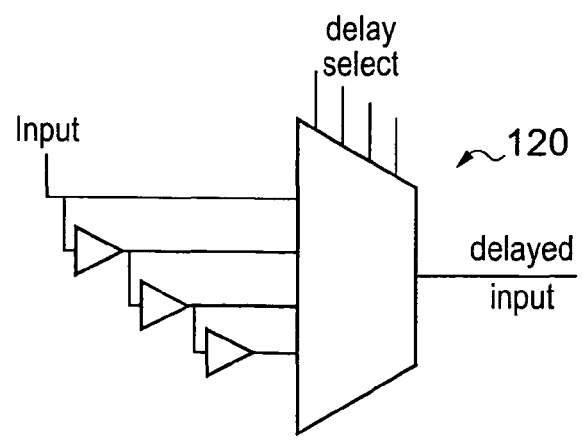

FIG. 4 shows a memory 20 with an input 90 for receiving an input signal CK which comprises a read request and an output 95 which outputs data Q. There is a further input 100 through which delay values can be entered to set the delays provided by delay circuitry 120, 122 and 124. There is also delay value calculating logic 130 and in this embodiment the delay values that are input via input 100 are maximum and minimum delays for the memory. The delay calculating logic 130 provides intermediate values between these maximum and minimum values for arrays that lie within the memory, in this diagram element 122. Each of the delay circuitry element 120, 122, 124 are programmable in that they can be adjusted in dependence on values output by delay calculating logic 130. In this example the minimum delay value received at input 100 is output to delay element 120, the maximum to delay element 124 and a calculated intermediate one to element 122. It would be clear to a skilled person that in reality a memory would comprise many more memory arrays and thus, many more intermediate values would be calculated.

These programmable delay elements can take a number of forms as will be clear to a skilled person however one example is shown as 120 in the side figure. In this example, the delays element comprises a multiplexer with different delay paths such that the input signal is sent via a particular delay path depending on the value input to the select input of the multiplexer.

In other embodiments (not shown) the delay value may be programmed at manufacture time by altering the mask of the circuit, perhaps by removing some vias, and in this way the delay values of the memory can be changed. Thus, at manufacture it is programmed to have the delay values desired for a particular implementation.

Figure 5:
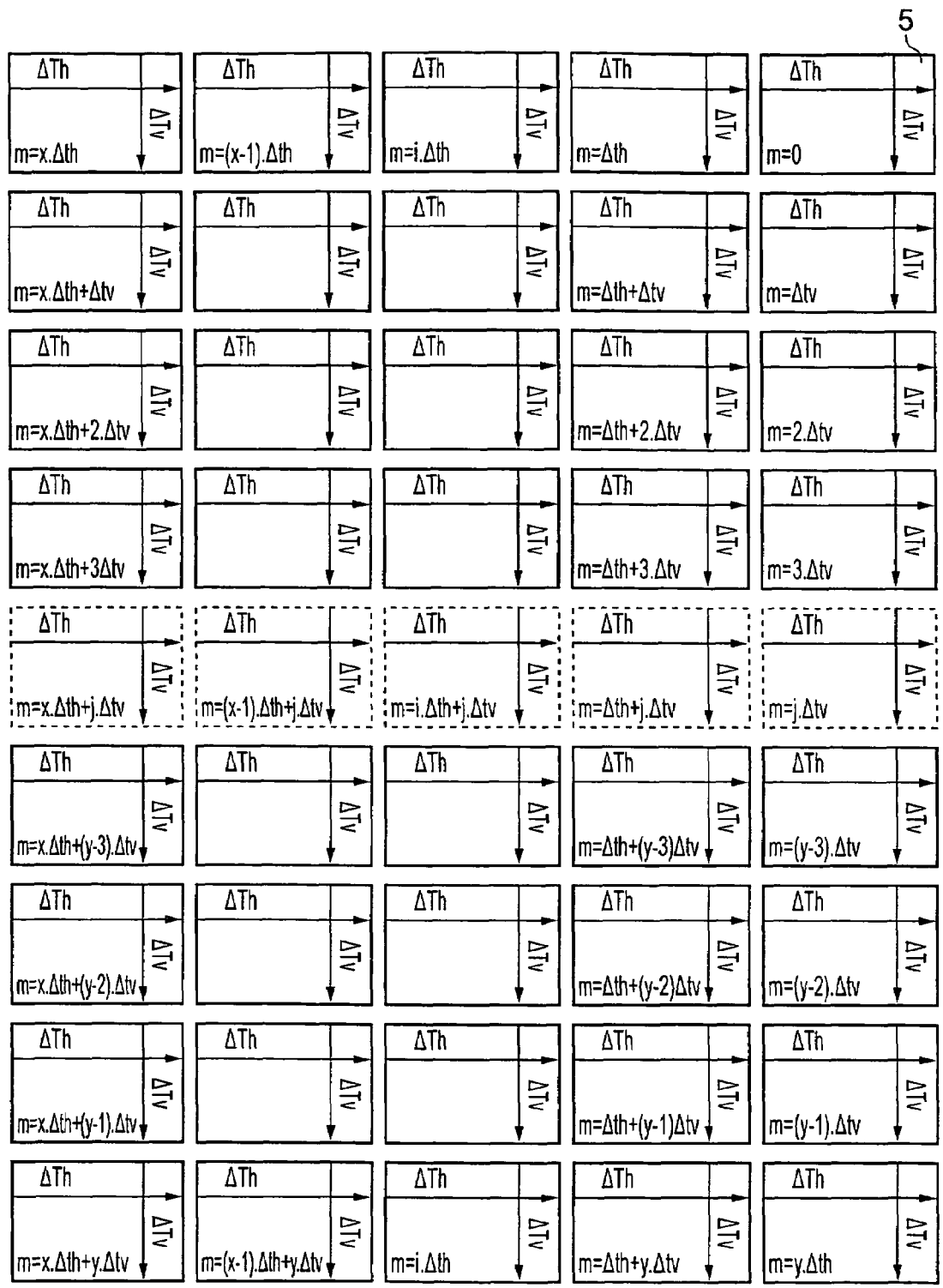
FIG. 5 schematically shows an array of memory banks according to an embodiment of the present invention.

FIG. 5 shows in schematic form a memory comprising a plurality of memory banks and gives the margin for each of the memory banks as m. This margin is the additional delay that can be provided to the memory bank owing to the fact that it has a smaller delay to reach it than the memory bank at the furthest corner of the memory which in this case is memory bank 5. Thus, memory bank 5 has no margin as it already has the longest delay for a signal to reach it and for the data stored therein to be output. The other arrays do have margins, the margins depending on their position within the memory as this position determines the delay for a signal to reach the bank and for the data from the bank to be output from the memory. Thus, in this embodiment the memory bank 7 closest to the input and the output has the highest margin and therefore can be provided with the longest additional delay, this being xΔth+yΔtv this being the time delay to move between x banks in a horizontal direction and y banks. Thus, banks with smaller timing paths have more margin built in so that as the timing path gets closer to the worst timing path the margin gets smaller. Thus, banks located closer to the input and output of the device are less susceptible to local bit cell variations as they are provided with additional delays and thus, even in poor cells the signal is likely to have reached a level that is detectable.

Figure 6:
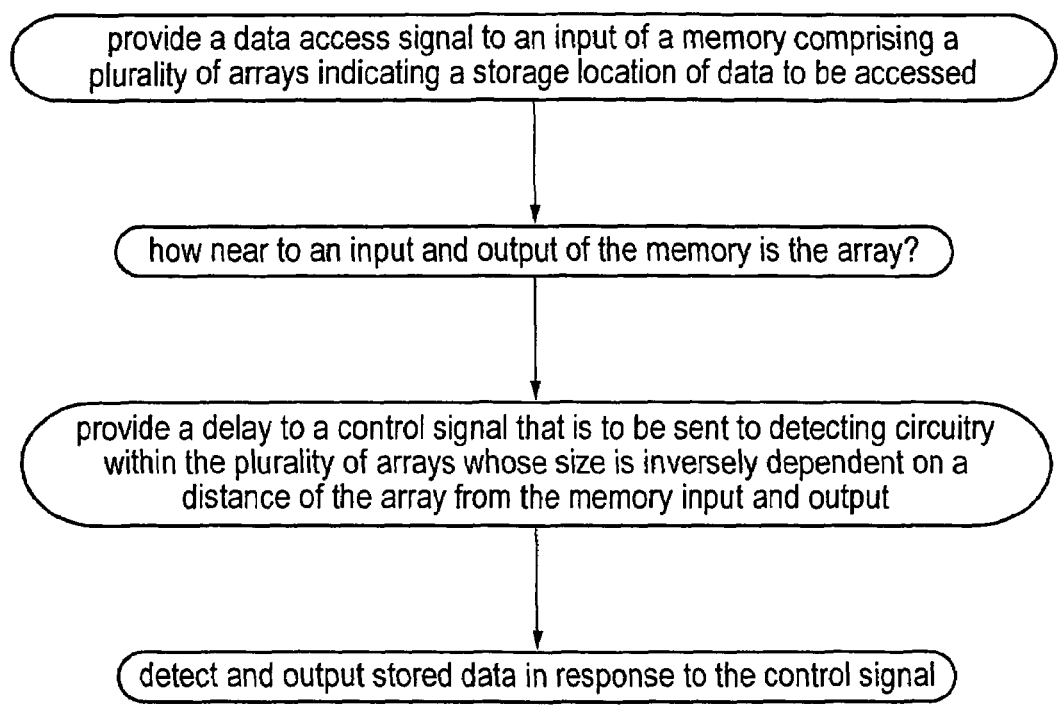
FIG. 6 shows a flow diagram illustrating steps in a method according to an embodiment of the present invention.

FIG. 6 shows a flow diagram illustrating a method according to an embodiment of the present invention. In this method a data access signal is provided to an input of a memory formed of a plurality of arrays of data storage locations. The data access signal requests access to data stored at an identified storage location within the memory. Depending on how near to an input and output of the memory the array holding the storage location is, a delay whose size is inversely dependent on the distance of the array from the input and output is provided to a control signal that is to be sent to detecting circuitry within the plurality of arrays. The data stored in the storage location within the array is then detected and output by this detecting circuitry.

Although illustrative embodiments of the invention have been described in detail herein with reference to the accompanying drawings, it is to be understood that the invention is not limited to those precise embodiments, and that various changes and modifications can be effected therein by one skilled in the art without departing from the scope and spirit of the invention as defined by the appended claims. For example, various combinations of the features of the following dependent claims could be made with the features of the independent claims without departing from the scope of the present invention.

I claim:
1. A memory comprising:
   an input for receiving an input signal and an output for outputting data;
   a plurality of data storage cells for storing individual units of data, said plurality of data storage cells being arranged in an array;
   a plurality of said arrays;
   each of said arrays comprising detecting circuitry for detecting and outputting stored data in response to a control signal received at said detecting circuitry;
   delay circuitry for providing a delay to said control signal sent to said detecting circuitry of at least some of said plurality of arrays, said delay provided to said control signal being longer for at least one array located relatively closer to said input and said output of said memory than to at least one array located relatively further from said input and said output of said memory, wherein said input is for receiving an input control signal for controlling access to data stored in said memory; and
   said output is for outputting data from said memory in response to said input control signal; said memory further comprising:
   input data communication circuitry for providing data communication of said input control signal to said plurality of arrays;
   output data communication circuitry for providing data communication between said output and said plurality of arrays; wherein
   said delay circuitry is adapted to provide said delay to said control signal sent to said detecting circuitry of at least some of said arrays that has a value dependent upon at least one of an input delay, said input delay being a time taken for said input control signal to reach said array, and an output delay, said output delay being a time taken for said data from said array to reach said output.

2. A memory according to claim 1, wherein said delay circuitry is adapted to provide a shorter delay to one of said plurality of arrays having a longer input and output delay and a longer delay provided to one of said plurality of arrays having a shorter input and output delay.

3. A memory according to claim 1, wherein said delay circuitry is adapted to provide said delay to said control signal sent to said detecting circuitry of each of at least some of said arrays such that a sum of said input delay, said output delay and said delay added by said delay circuitry is substantially equal for said at least some of said arrays.

4. A memory according to claim 1, wherein said delay circuitry comprises an initial delay element for providing a first delay to said control signal sent to all of said arrays and further delay elements for providing further delays to said control signal sent to at least some of said arrays.

5. A memory according to claim 4, wherein said first delay is equal to a delay calculated as being required for a worst case storage cell that it is calculated will occur in at least one of said plurality of arrays.

6. A memory according to claim 4, wherein said first delay is equal to a delay calculated as being required for a worst case storage cell that it is calculated will occur in said memory.

7. A memory according to claim 1, wherein said plurality of arrays are arranged in a memory bank array and said delay circuitry is adapted to add said delay to said control signal sent to one of said plurality of arrays in dependence upon a location of said one of said plurality of arrays within said memory bank array.

8. A memory according to claim 1, wherein said control signal controlling said detecting circuitry and said input control signal received at said input are a same signal, said delay circuitry delaying said input control signal to said detecting circuitry and not to said data storage cells in said array.

9. A memory according to claim 8, wherein said input data communication circuitry comprises an input path for providing said input control signal to at least one of said storage cells of said array and a further input path for providing said input control signal to said detecting circuitry, said further input path comprising said delay circuitry.

10. A memory according to claim 9, wherein said further input path is an extension of said input path.

11. A memory according to claim 1, wherein said delay circuitry comprises at least one buffer.

12. A memory according to claim 1, wherein said detecting circuitry comprises at least one sense amplifier.

13. A memory according to claim 1, wherein said memory is an SRAM memory comprising bit lines, and said input control signal is an input signal to control said bit lines.

14. A memory comprising:
an input for receiving an input signal and an output for outputting data;
a plurality of data storage cells for storing individual units of data, said plurality of data storage cells being arranged in an array;
a plurality of said arrays;
each of said arrays comprising detecting circuitry for detecting and outputting stored data in response to a control signal received at said detecting circuitry;
delay circuitry for providing a delay to said control signal sent to said detecting circuitry of at least some of said plurality of arrays, said delay provided to said control signal being longer for at least one array located closer to said input and said output of said memory than to at least one array located further from said input and output of said memory; and
a delay control input for receiving a signal indicating at least one value for at least one delay, said delay circuitry being programmable, such that at least one of said delays provided by said delay circuitry is altered in response to said at least one value.

15. A memory according to claim 14, wherein said delay control input is for receiving a signal indicating maximum and minimum delay values, said delay circuitry comprising logic to calculate any intermediate delays in dependence upon said maximum and minimum delay values.

16. A memory according to claim 15, said memory further comprising a delay control input for receiving a signal indicating a value for said first delay, said first delay provided by said initial delay element depending on said value received at said delay control input.

17. A method of reading data from a memory comprising a plurality of arrays of data storage cells for storing individual units of data, said memory having an input and an output, said method comprising the steps of:
providing a data access signal to said input of said memory indicating a storage location of data to be accessed;
providing an input control signal to be sent to detecting circuitry located within said plurality of arrays, said detecting circuitry for detecting and outputting stored data at an output in response to said input control signal;
delaying said input control signal with respect to said data access signal by different amounts for at least some of said plurality of arrays, said input control signal delay provided to said input control signal being dependent upon at least one of an input delay, said input delay comprising a time taken for said input control signal received at said input to reach said array to control access to data stored in said memory at said input, and an output delay, said output delay comprising a time taken for said data from said array to reach said memory output, said input control signal delay is longer for at least one array located relatively closer to said memory input and said memory output than said input control signal delay is for at least one array located relatively further from said memory input and said memory output.

* * * * *